(12) United States Patent
Chen et al.

(10) Patent No.: US 7,557,606 B1
(45) Date of Patent: Jul. 7, 2009

(54) SYNCHRONIZATION OF DATA SIGNALS AND CLOCK SIGNALS FOR PROGRAMMABLE LOGIC DEVICES

(75) Inventors: Xiaotao Chen, Macungie, PA (US); Jun Zhao, Allentown, PA (US); Eric Ting, Macungie, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/105,146

(22) Filed: Apr. 17, 2008

(51) Int. Cl.
 *H03K 19/173* (2006.01)
(52) U.S. Cl. ................................ 326/38; 326/93; 716/6
(58) Field of Classification Search ............. 326/37–41, 326/93; 716/4–6
 See application file for complete search history.

(56) References Cited
 U.S. PATENT DOCUMENTS
 6,321,366 B1* 11/2001 Tseng et al. ................. 716/6

| | | | |
|---|---|---|---|
| 6,486,705 B2 | 11/2002 | Andrews et al. | |
| 6,873,187 B1 | 3/2005 | Andrews et al. | |
| 7,107,477 B1 | 9/2006 | Singh et al. | |
| 7,312,631 B1* | 12/2007 | Bauer et al. | 326/38 |

\* cited by examiner

*Primary Examiner*—Don P Le
(74) *Attorney, Agent, or Firm*—Haynes and Boone, LLP

(57) ABSTRACT

Techniques for synchronizing data signals and clock signals of a programmable logic device (PLD) are provided. In one example, a method includes preparing an initial configuration of the PLD identifying a plurality of data paths associated with the data signals and a plurality of clock paths associated with the clock signals. The method also includes identifying a hold time violation associated with at least one of the data paths, wherein at least one of the clock signals is used to synchronize the data path. The method further includes selectively adjusting a delay period of a delay element of at least one of the clock paths associated with the clock signal to attempt to correct the hold time violation without concurrently attempting to correct any setup time violation associated with the data path.

20 Claims, 4 Drawing Sheets

SYNCHRONIZATION OF DATA SIGNALS AND CLOCK SIGNALS FOR PROGRAMMABLE LOGIC DEVICES

TECHNICAL FIELD

The present invention relates generally to programmable logic devices and, more particularly, to the timing of signal paths of programmable logic devices.

BACKGROUND

Programmable logic devices (PLDs), such as field programmable gate arrays (FPGAs) or complex programmable logic devices (CPLDs), may be configured to provide user-defined features. In this regard, PLDs typically include large numbers of logic blocks and/or other components interconnected through various signal paths.

During operation, data signals passed through such signal paths may be latched into flip-flops by various clock signals. For data signals to be properly clocked through the PLD, the data signals and clock signals must be properly synchronized. However, excessive delays of the data signals or clock signals can lead to undesirable results. For example, if a clock signal is excessively delayed with respect to a data signal (e.g., the clock signal fails to arrive at a destination flip-flop before the next data signal by at least a hold time period), then a "double clocking" condition can occur. In this case, if the value of the data signal changes before a previous value of the data signal is clocked in to the destination flip-flop (e.g., before a corresponding clock signal arrives at the destination flip-flop), then the previous value of the data signal will be lost.

In another example, if a data signal is excessively delayed with respect to a clock signal (e.g., the current data signal fails to arrive at a destination flip-flop before the clock signal by at least a setup time period), then a "zero clocking" condition can occur. In this case, if the value of the data signal does not change before a previous value of the data signal is stored by the destination flip-flop (e.g., before a corresponding clock signal arrives at the destination flip-flop), then the previous value of the data signal will be incorrectly clocked into the destination flip-flop.

Various approaches have been developed to address such double clocking and zero clocking concerns. In some approaches, data signals may be delayed by, for example, routing the data signals through slow interconnects and/or detours, thereby increasing the lengths of the data paths. However, such approaches can greatly increase the time required to prepare PLD configurations and, in many cases, cannot guarantee improved performance, especially for very congested designs. Moreover, such approaches often utilize an "all or nothing" approach which limits their usefulness in finding at least partial solutions to synchronization problems.

Accordingly, there is a need for an improved approach to the adjustment of signal paths through a PLD to properly synchronize data signals with clock signals through the PLD.

SUMMARY

In accordance with one embodiment of the present invention, a method of synchronizing data signals and clock signals of a programmable logic device (PLD) includes preparing an initial configuration of the PLD identifying a plurality of data paths associated with the data signals and a plurality of clock paths associated with the clock signals; identifying a hold time violation associated with at least one of the data paths, wherein at least one of the clock signals is used to synchronize the data path; and selectively adjusting a delay period of a delay element of at least one of the clock paths associated with the clock signal to attempt to correct the hold time violation without concurrently attempting to correct any setup time violation associated with the data path.

In accordance with another embodiment of the present invention, a system includes one or more processors; and one or more memories adapted to store a plurality of computer readable instructions which when executed by the one or more processors are adapted to cause the system to perform a method of synchronizing data signals and clock signals of a programmable logic device (PLD), the method comprising: preparing an initial configuration of the PLD identifying a plurality of data paths associated with the data signals and a plurality of clock paths associated with the clock signals, identifying a hold time violation associated with at least one of the data paths, wherein at least one of the clock signals is used to synchronize the data path, and selectively adjusting a delay period of a delay element of at least one of the clock paths associated with the clock signal to attempt to correct the hold time violation without concurrently attempting to correct any setup time violation associated with the data path.

In accordance with another embodiment of the present invention, a system for synchronizing data signals and clock signals of a programmable logic device (PLD) includes means for preparing an initial configuration of the PLD identifying a plurality of data paths associated with the data signals and a plurality of clock paths associated with the clock signals; means for identifying a hold time violation associated with at least one of the data paths, wherein at least one of the clock signals is used to synchronize the data path; and means for selectively adjusting a delay period of a delay element of at least one of the clock paths associated with the clock signal to attempt to correct the hold time violation without concurrently attempting to correct any setup time violation associated with the data path.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Various techniques further described herein may be used to remedy hold time violations of PLD data paths independently of setup time violations. Advantageously, such techniques may be used to adjust delay periods and clock periods of clock signals associated with the data paths to determine whether such adjustments would correct at least one or more hold time violations. In various embodiments, clock signals associated with the least critical data paths may be adjusted before other clock signals to decrease the effects of reduced clock speeds on high priority data paths. As a result, PLD hold time violations may be at least partially corrected without adversely impacting critical PLD data paths.

Advantageously, the delay periods and/or clock periods may be selectively adjusted to correct hold time violations without concurrently attempting to correct possible setup time violations (e.g., hold time violations may be corrected regardless of whether adjustments made for such corrections may affect setup time constraints). In this regard, satisfaction of setup time constraints may be sacrificed based on their relative criticality to the operation of the PLD if desired to at least partially improve compliance with hold time constraints.

Figure 1:
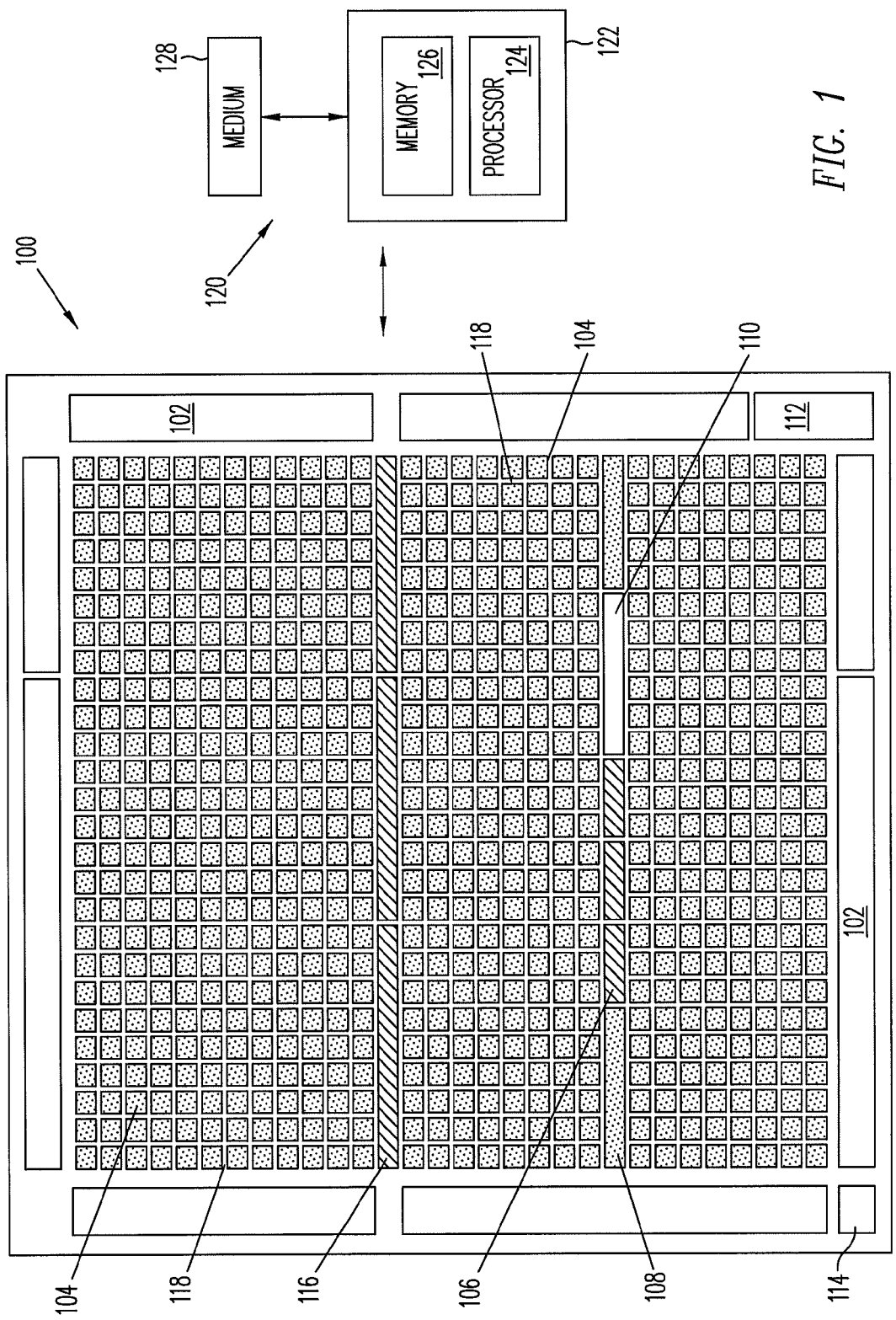
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein.

For example, in one embodiment, means such as processor 124 configured with such software may be used for: preparing an initial configuration of PLD 100 identifying a plurality of data paths associated with a plurality of data signals of PLD 100 and a plurality of clock paths associated with a plurality of clock signals of PLD 100; identifying a hold time violation associated with at least one of the data paths, wherein at least one of the clock signals is used to synchronize the data path; and selectively adjusting a delay period of a delay element of at least one of the clock paths associated with the clock signal to attempt to correct the hold time violation without concurrently attempting to correct any setup time violation associated with the data path.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

In various embodiments, such configuration data identifies the configuration of routing resources 118 to determine the placement and routing of data paths and clock paths through PLD 100. For example, interconnections between various components of PLD 100 may be specified by such configuration data.

Figure 2:
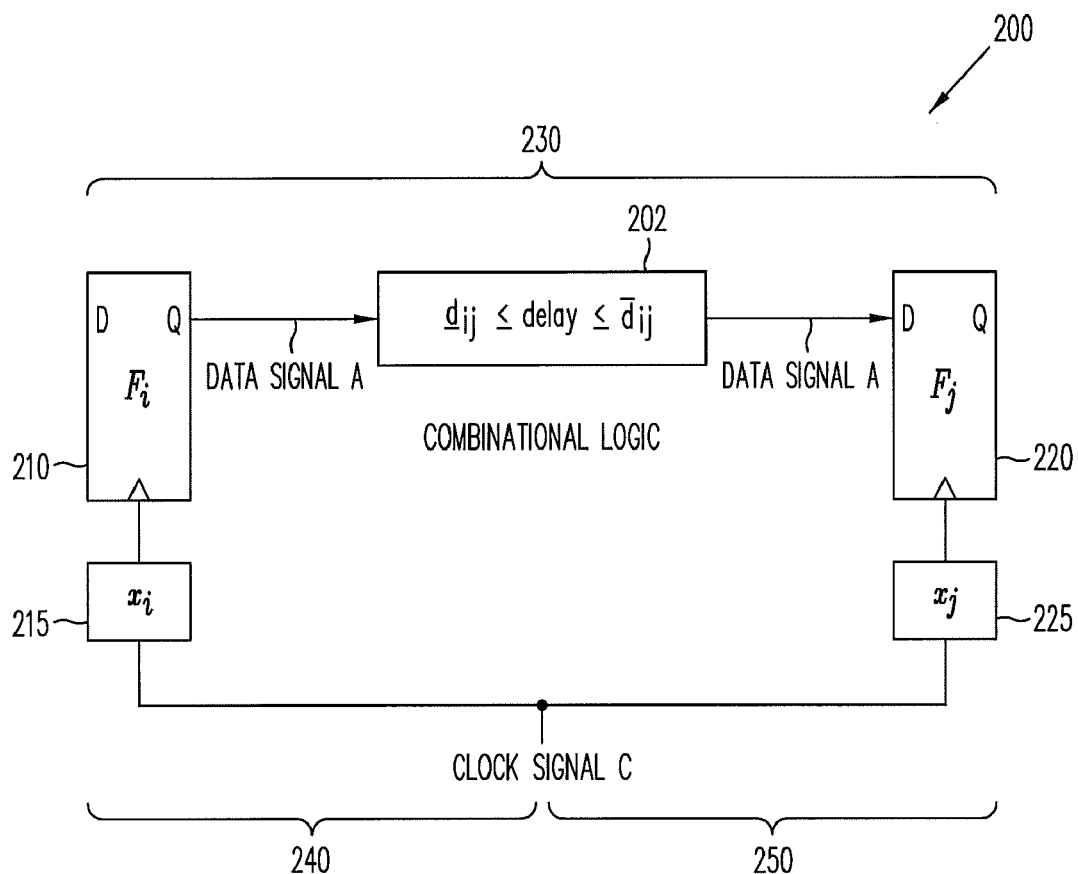
FIG. 2 illustrates a circuit providing an example of data and clock paths through a PLD in accordance with an embodiment of the invention

FIG. 2 illustrates a circuit 200 that may be specified by such configuration data in accordance with an embodiment of the invention. Circuit 200 provides an example of a data path 230 of PLD 100. In particular, data path 230 provides a path for a data signal A to pass from a flip-flop (FF) 210 to a FF 220 through combinational logic 202.

Circuit 200 also provides examples of clock paths 240 and 250 of PLD 100. In particular, clock paths 240 and 250 provide paths for a clock signal C to pass to FF 210 and FF 220 through delay elements 215 and 225 which delay clock signal C by delay periods of $x_i$ and $x_j$, respectively.

It will be appreciated that circuit 200 illustrates a subset of many possible data paths and clock paths through PLD 100. In this regard, PLD 100 may include a plurality of different data signals and clock signals with various associated signal paths. It will also be appreciated that although FIG. 2 illustrates signal paths relative to FFs 210 and 220, such components are illustrated as examples only. PLD 100 may include signal paths between these and other different components of PLD 100 (for example, between programmable logic blocks, physical input/output pins, other flip-flops, and/or other components).

When FF 210 sends data signal A through combinational logic 202 to FF 220, its delay through combinational logic 202 is bounded below by $\underline{d}_{ij}$ and above by $\overline{d}_{ij}$. If there is no path from FF 210 to FF 220, $\underline{d}_{ij}=\infty$, and $\overline{d}_{ij}=-\infty$.

When clock signal C is provided to circuit 200, a race is set in motion between data signal A which is traveling from FF 210 to FF 220 through combinational logic 202, and clock signal C which is traveling to FFs 210 and 220 through delay elements 215 and 225, respectively.

To address possible double clocking of data signal A into FF 220 (i.e., the clock signal to FF 220 being excessively delayed), circuit 200 may be implemented with a hold time constraint (HOLD). In this regard, data path 230 may be implemented such that a new value of data signal A arrives at FF 220 no sooner than a predetermined hold time period following the time that clock signal C is received by FF 220 to clock in the previous value of data signal A. A hold time violation occurs at FF 220 when the elapsed time between the arrival of the edge of clock signal C associated with a first value of data signal A and the arrival of a second value of data signal A is less than the requisite hold time. In one embodiment, the hold time constraint for data path 230 of circuit 200 may be written as follows:

$$x_i+\underline{d}_{ij}\geq x_j+\text{HOLD} \qquad \text{(equation 1)}$$

To address possible zero clocking of data signal A into FF 220 (i.e., the data signal A being excessively delayed), data path 230 may also be implemented with a setup time constraint (SETUP). In this regard, data path 230 may be implemented such that a new value of data signal A arrives at FF 220 no later than a predetermined setup time period before FF 220 receives an edge of clock signal C used to clock in the new value of data signal A into FF 220. A setup time violation occurs at FF 220 when the elapsed time between the arrival of a value of data signal A and the arrival of the edge of clock signal C associated with the value of data signal A is less than the requisite setup time. In one embodiment, the setup time constraint for circuit 200 may be written as follows, where P is the period of clock signal C:

$$x_i+\overline{d}_{ij}\leq x_j+P-\text{SETUP} \qquad \text{(equation 2)}$$

It will be appreciated that similar hold time constraints and setup time constraints may be associated with all data paths of PLD 100.

Figure 3:
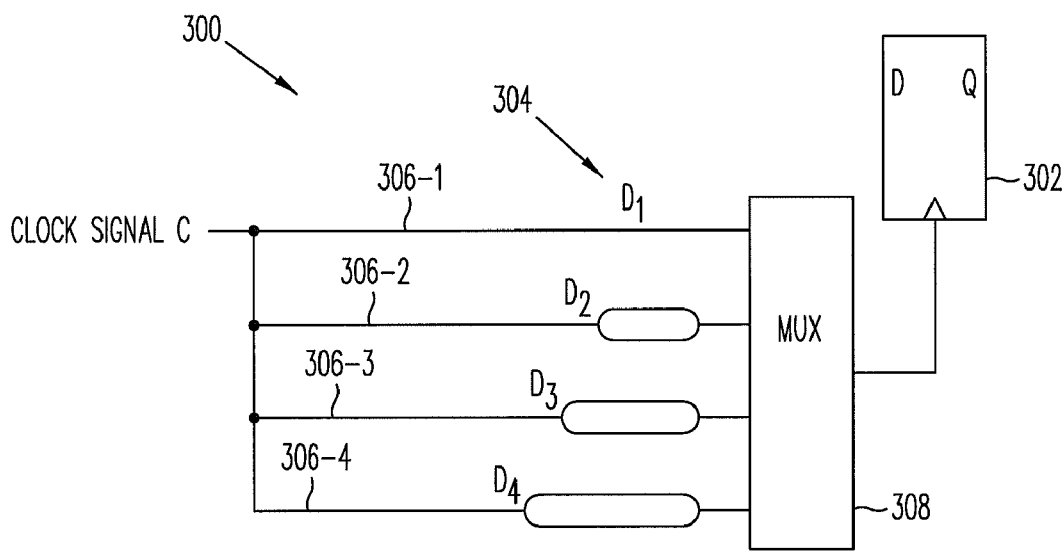
FIG. 3 illustrates a circuit providing a flip-flop and a corresponding delay selection unit in accordance with an embodiment of the invention.

FIG. 3 illustrates a circuit 300 providing a FF 302 and a corresponding delay selection unit 304 in accordance with an embodiment of the invention. FF 302 may be viewed as one of many embedded memory elements of PLD 100 (for example, as FF 210 or FF 220 of FIG. 2). Delay selection unit 304 may be used to implement, for example, delay element 215 or 225 of FIG. 2.

As shown in FIG. 3, delay selection unit 304 in this example includes four different delay lines 306-1, 306-2, 306-3 and 306-4, a particular one of which is selected by multiplexer 308 in response to appropriate control signals for use in propagating clock signal C to the clock signal input of FF 302. Each of delay lines 306-1, 306-2, 306-3 and 306-4 provides a different delay period, with these delays being denoted $D_1$, $D_2$, $D_3$, and $D_4$, respectively, in order of increasing delay. The particular number of delay lines shown in delay selection unit 304 of FIG. 3 is by way of example only, and other embodiments may use more or fewer delay lines in a given delay selection unit.

A suitable set of delay lines for a given circuit application may be determined, for example, by analyzing benchmark circuits over various candidate sets. Preferably, the best set is chosen, and a circuit simulation is used to determine upper and lower delay bounds for each of at least a subset of the delay lines. Such analysis and simulation techniques are well-known to those skilled in the art, and are therefore not described in further detail herein.

Additional details regarding delay selection units such as delay selection unit 204 of FIG. 3 as well as other signal distribution techniques suitable for use in conjunction with embodiments described herein may be found in U.S. Pat. No. 6,486,705, which is hereby incorporated by reference in its entirety. However, it will be appreciated that the present disclosure does not require any particular configuration of such units.

In accordance with various techniques further described herein, the frequency of clock signal C and the delays provided by delay elements 215 and 225 of FIG. 2 may be adjusted to satisfy hold time constraints of various signal paths of PLD 100 to reduce double clocking errors associated with various signal paths of PLD 100.

Figure 4:
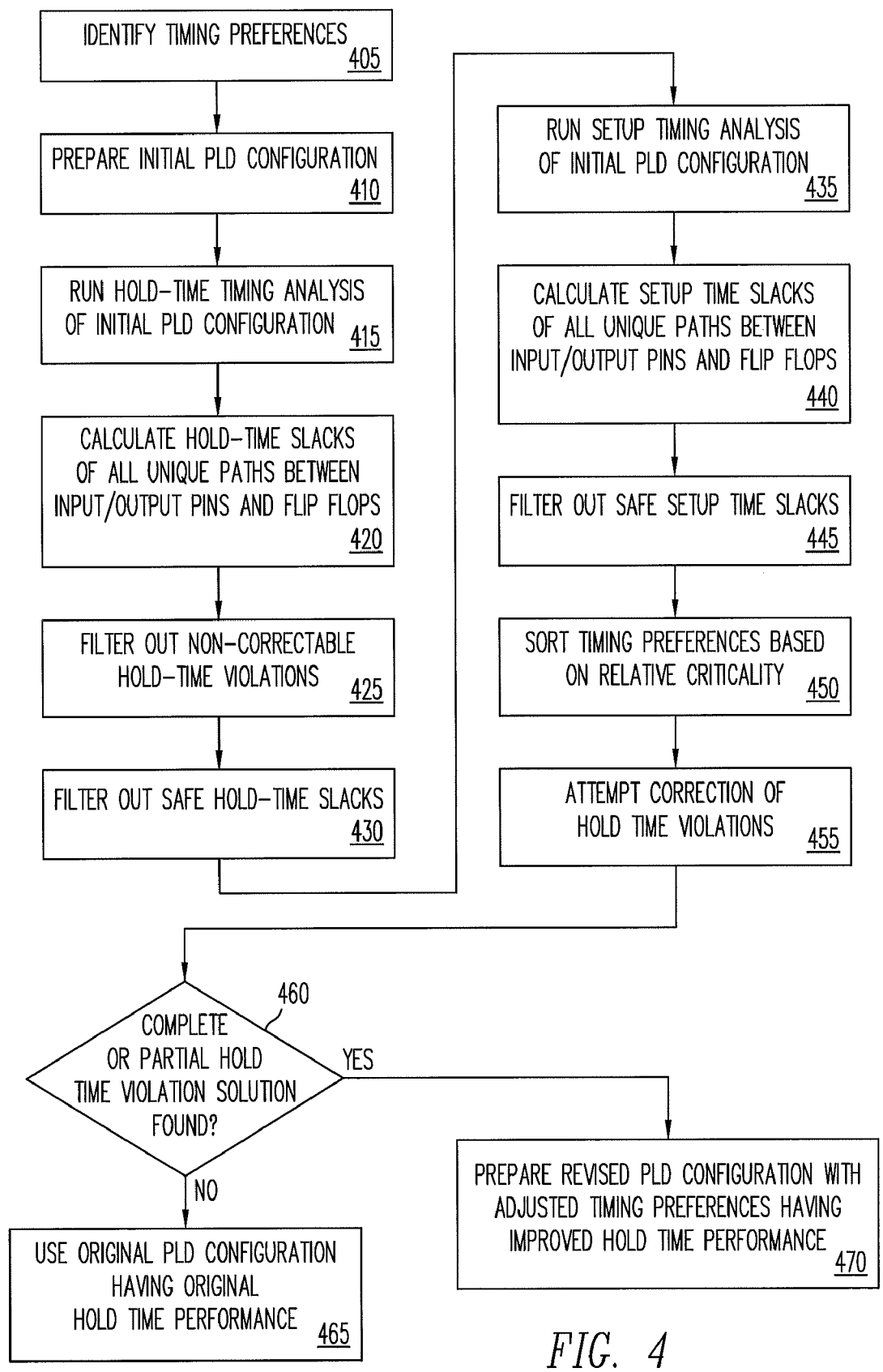
FIG. 4 illustrates a process of adjusting a PLD configuration to satisfy hold time constraints of signal paths of the PLD in accordance with an embodiment of the invention.

For example, FIG. 4 illustrates a process of adjusting a PLD configuration to satisfy hold time constraints of signal paths of PLD 100 in accordance with an embodiment of the invention. For example, in one embodiment, the process of FIG. 4 (as well as the process of FIG. 5 further described herein) may be performed by system 120 in accordance with appropriate software stored on computer readable medium 128 and/or in memory 126.

In step 405, a plurality of timing preferences associated with PLD 100 are determined, for example, by a user (e.g., a developer of a PLD configuration) of system 120 or by software running on processor 124. In one embodiment, such timing preferences may correspond to desired minimum clock periods associated with one or more clock signals of PLD 100. For example, in one embodiment, a timing preference may identify clock signal C of PLD 100 as having a particular clock period, while another timing preference may identify another clock signal (not shown) of PLD 100 as having a different clock period. It will be appreciated that any desired number of timing preferences may be identified in step 405 and may be stored, for example, in a file maintained by computer readable medium 128 and/or in memory 126.

In step 410, an initial PLD configuration (e.g., a configuration specifying the implementation of routing resources 118) is prepared which identifies, for example, signal paths of various data signals and clock signals of PLD 100 using the timing preferences identified in step 405. For example, in one embodiment, initial configurations of circuits 200 and 300, as well as initial configurations of additional circuits of PLD 100 may be prepared in step 410.

In step 415, a timing analysis of the initial PLD configuration is run to determine the actual hold times available for the various data paths of the initial PLD configuration. Then, in step 420, a hold time slack value is calculated for each data path of the initial PLD configuration. For example, to avoid double clocking of data values into FF 220, the data path between FF 210 and FF 220 in circuit 200, should satisfy a hold time constraint identified by equation 1 described above. The hold time slack value corresponds to the difference between: (1) the hold time constraint required to properly clock data into FF 220; and (2) the actual hold time available for the data path of FIG. 2 as calculated in the timing analysis of step 415.

It will be appreciated that delay periods $x_i$ and $x_j$ of equation 1 are initially set to predetermined values in the initial PLD configuration. In addition, the lower bound of the delay through combinational logic 202 (e.g., the delay represented by $\underline{d}_{ij}$) of equation 1 can be determined by the a timing analysis of step 415 (e.g., using the period P of clock signal C given by the timing preferences identified in step 405). Accordingly, it can be determined whether equation 1 is satisfied for data path 230 of circuit 200.

As identified in equation 1, in order to avoid double clocking, the difference of the delay periods provided by delay elements 215 and 225 (e.g., subtracting delay period $x_j$ from delay period $x_i$), summed with the lower bound of the delay through combinational logic 202 should be greater than or equal to the hold time constraint of circuit 200. Thus, the hold time slack value (HOLDSLACK) can be determined by the following equation 3:

$$HOLDSLACK = x_i - x_j + \underline{d}_{ij} - HOLD \quad \text{(equation 3)}$$

Considering equation 3 in view of equation 1, it will be appreciated that positive hold time slack values will satisfy the hold time constraint of data path 230, whereas negative hold time slack values will not satisfy the hold time constraint of data path 230 and therefore will correspond to hold time violations (e.g., a double clocking condition).

In step 425, any "non-correctable" hold time violations that cannot be remedied through adjustment of delay elements 215 and 225 are filtered out from the set of hold time slack values determined in step 420. In one embodiment, such non-correctable hold time slack values are not considered in subsequent steps of FIGS. 4 and 5. In this regard, it will be appreciated from the example shown in FIG. 2 that different delay periods provided by delay elements 215 and 225 (e.g., $x_i$ and $x_j$) can affect the hold time slack values calculated in step 425. However, for some implementations of circuit 200, the hold time constraint will not be satisfied, regardless of all possible delay periods $x_i$ and $x_j$ (for example, where the lower bound of the delay through combinational logic 202 is much smaller than the possible delay periods available from delay selection units 304 used to implement delay elements 215 and 225).

In step 430, "safe" hold time slack values are filtered out from the set of hold time slack values determined in step 420. In one embodiment, such safe hold time slack values are not considered in subsequent steps of FIGS. 4 and 5. In this regard, it will be appreciated from the example shown in FIG. 2 that different delay periods provided by delay elements 215 and 225 (e.g., $x_i$ and $x_j$) can affect the hold time slack values calculated in step 425. However, for some implementations of circuit 200, the hold time constraint will be satisfied for all possible delay periods $x_i$ and $x_j$ (for example, where the lower bound of the delay through combinational logic 202 is much larger than the possible delay periods available from delay selection units 304 used to implement delay elements 215 and 225).

In step 435, a timing analysis of the initial PLD configuration is then run to determine actual setup times available for the various data paths of the initial PLD configuration. In step 440, a setup time slack value is calculated for each data path of the initial PLD configuration. For example, to avoid zero clocking of data values into FF 220, data path 230 between FF 210 and FF 220 in circuit 200 should satisfy a setup time constraint identified by equation 2 described above. The setup time slack value corresponds to the difference between: (1) the setup time constraint required to properly clock data into FF 220; and (2) the actual setup time available for the data path of FIG. 2 as calculated in the timing analysis of step 435.

As previously discussed, delay periods $x_i$ and $x_j$ are initially set to predetermined values in the initial PLD configuration. In addition, the upper bound of the delay through combinational logic 202 (e.g., the delay represented by $\overline{d}_{ij}$) of equation 2 can be determined by the timing analysis of step 435 (e.g., using the period P of clock signal C given by the timing preferences identified in step 405). Accordingly, it can be determined whether equation 2 is satisfied for data path 230 of circuit 200.

As identified in equation 2, in order to avoid zero clocking, the difference of the delay periods provided by delay elements 215 and 225 (e.g., subtracting delay period $x_i$ from delay period $x_j$), summed with the upper bound of the delay through combinational logic 202, and also summed with the clock period of clock signal C should be greater than or equal to the setup time constraint associated with circuit 200. Thus, the setup time slack value (SETUPSLACK) can be determined by the following equation 4:

$$SETUPSLACK = x_j - x_i + \overline{d}_{ij} + P - SETUP \quad \text{(equation 4)}$$

Considering equation 4 in view of equation 2, it will be appreciated that positive setup time slack values will satisfy the setup time constraint of data path 230, whereas negative setup time slack values will not satisfy the setup time constraint of data path 230 and therefore will correspond to a setup time violation (e.g., a zero clocking condition).

In step 445, "safe" setup time slack values are filtered out from the setup time slack values determined in step 440. In one embodiment, such safe setup time slack values are not considered in subsequent steps of FIGS. 4 and 5. In this regard, it will be appreciated from the example shown in FIG. 2 that different delay periods provided by delay elements 215 and 225 (e.g., $x_i$ and $x_j$) can affect the setup time slack values calculated in step 440. However, for some implementations of circuit 200, the setup time constraint will be satisfied for all possible delay periods $x_i$ and $x_j$ (for example, where the upper bound of the delay through combinational logic 202 is much larger than the possible delay periods available from delay selection units 304 used to implement delay elements 215 and 225).

In step 450, the timing preferences previously identified in step 405 are sorted (e.g., ranked) based on their relative criticality to the proper operation of PLD 100. For example, in one embodiment, such timing preferences may be clock periods of one or more clock signals (e.g., clock signal C or other clock signals) of PLD 100. In this regard, the various clock signals used by PLD 100 may be sorted, with the clock signal of the least critical data path ranked first (e.g., the clock signal used to synchronize data signals along data paths that are deemed least critical to proper operation of PLD 100).

In one embodiment, this sorting may be performed in accordance with the following equation 5, wherein "MAXDELAY" identifies the worst case data path delay (e.g., the maximum value of $\overline{d}_{ij}$) of all data paths associated with a particular clock signal (e.g., timing preference) having a period P:

$$\text{RANK} = \text{MAXDELAY}/(P - \text{SETUP}) \quad \text{(equation 5)}$$

In this regard, it will be appreciated that a value for RANK may be determined for each timing preference used by PLD 100, with larger values indicating more critical timing preferences.

In step 455, an attempt is made to correct hold time violations associated with hold time slack values that were not filtered out in step 425. In this regard, the delay periods of delay elements of the various clock paths of PLD 100 are adjusted and the clock period of clock signals associated with the data paths are selectively adjusted to correct, if possible, at least one or more hold time violations associated with hold time slack values that were not filtered out in step 425.

Figure 5:
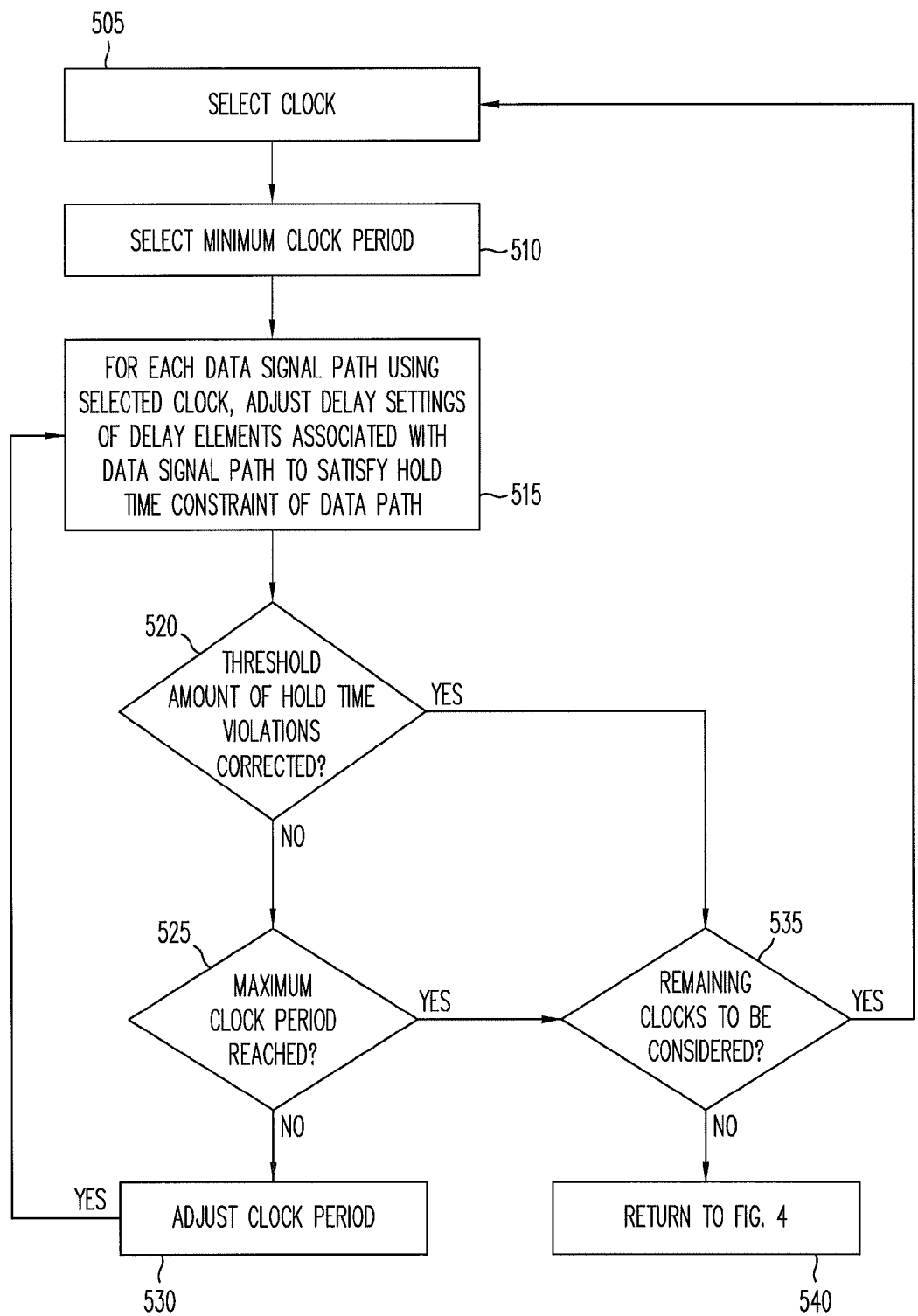
FIG. 5 illustrates a process to adjust delay periods and clock signal periods in accordance with an embodiment of the invention.

In this regard, FIG. 5 illustrates a process that may be performed during step 455 of FIG. 4. In the embodiment described in FIG. 5, timing preferences correspond to the periods of clock signals used by PLD 100. Turning now to the steps of FIG. 5, in step 505, a first clock signal is selected according to the sorted order of timing preferences obtained in step 450. For example, in one embodiment, the least critical clock signal identified in step 450 of FIG. 4 may be selected (e.g., the clock signal having the smallest RANK value).

In step 510, a minimum clock period for the selected clock signal is identified. For example, in one embodiment, the minimum clock period may correspond to a clock period identified in the timing preferences of step 405 of FIG. 4.

In step 515, for each data path of PLD 100 associated with the selected clock signal, delay periods of the particular delay elements of an associated clock path are adjusted to satisfy the particular hold time constraint associated with the data path.

For example, for data path 230 of circuit 200 of FIG. 2, the delay periods of delay elements 215 and 225 of clock paths 240 and 250, respectively, may be adjusted. In this regard, it will be appreciated that such adjustments may be implemented, for example, by providing appropriate control signals to corresponding multiplexers 308 of various delay selection units 304 used to implement the delay elements.

In one embodiment, delay periods of the delay elements may be adjusted in step 515 accordance with a modified Bellman-Ford process. U.S. Pat. No. 6,873,187, which is hereby incorporated by reference in its entirety, provides further details of one such modified Bellman-Ford process using hold time constraints and setup time constraints. In step 515, the modified Bellman-Ford process of the above patent may be implemented to consider only hold time constraints, but not setup time constraints.

As a result of step 515, all, some, or none of the hold time violations of the various data paths associated with the selected clock signal will have been corrected (thereby satisfying the hold time constraints associated with such data paths) by adjusting delay periods of delay elements of the associated clock paths. Accordingly, in step 520, a determination is made as to whether the clock period of the selected clock signal should be adjusted. For example, if a threshold amount of the hold time violations are corrected in step 520, then the process of FIG. 5 continues to step 525. Otherwise, the process of FIG. 5 continues to step 535. In one embodiment, the threshold amount considered in step 520 corresponds to only a portion of the total number of hold time violations associated with hold time slack values that were not filtered out in step 425. In another embodiment, the threshold amount corresponds to all of the hold time violations associated with hold time slack values that were not filtered out in step 425.

In step 525, a determination is made as to whether the maximum clock period of the selected clock signal has been reached. In this regard, each clock signal of PLD 100 corresponding to one of the timing preferences previously identified in step 405 of FIG. 4 may have an associated minimum clock period and an associated maximum clock period. If the maximum clock period has been reached, then the process of FIG. 5 continues to step 535. Otherwise, the process of FIG. 5 continues to step 530.

In step 530, the clock period of the selected clock signal is adjusted. In one embodiment, the clock period may be adjusted in accordance with a binary search process in a range from the minimum clock period and the maximum clock period. Following step 530, the process of FIG. 5 returns to step 515 wherein the delay periods of the particular delay elements of each clock path associated with the clock signal are adjusted to satisfy the particular hold time constraint associated with the data path. However, in this subsequent iteration of step 515, the adjusted clock period determined in step 530 is used instead of the minimum clock period used in the previous iteration of step 515.

It will be appreciated that by looping through steps 505 through 530, the clock period of the selected clock signal can be gradually increased from a minimum clock period up to either the maximum clock period or to an interim clock period which may permit some or all of the hold time violations of associated data paths to be corrected.

In step 535, a determination is made as to whether additional clock signals (e.g., corresponding to additional timing preferences) remain to be considered. If all clock signals have been considered, then the process of FIG. 5 continues to step 540 where it returns to the process of FIG. 4. Otherwise, if additional clock signals remain to be considered, then the process of FIG. 5 returns to step 505 where the next clock signal is selected according to the sorted order of timing preferences obtained in step 450. Various steps of FIG. 5 can be repeated to adjust the clock periods of the remaining clock signals as previously described.

It will be appreciated that as a result of the process of FIG. 5, the clock periods of one or more clock signals of PLD 100 may be adjusted in a manner to satisfy at least some of the hold time constraints of their associated data paths. Due to the sorting of timing preferences based on RANK values, this can be advantageously performed with minimal impact on setup time slack values.

Accordingly, returning to FIG. 4, in step 460, a determination is made as to whether some of the remaining hold time violations (e.g., corresponding to hold time violations associated with hold time slack values that were not filtered out in previous step 425) of PLD 100 were corrected as a result of the adjustments made to the clock periods of associated clock signals performed in FIG. 5. If at least some (e.g., a partial solution) or all (e.g., a complete solution) of the hold time violations were corrected using the adjusted clock periods, then the process of FIG. 4 continues to step 470 where a revised PLD configuration is prepared using revised timing preferences (e.g., corresponding to the adjusted clock periods). However, if none of the hold time violations were corrected using the adjusted clock periods, then the process of FIG. 4 continues to step 465 where the original PLD configuration of step 405 is used with the initial timing preferences (e.g., minimum clock periods) identified in step 405. Following the process of FIG. 4, the original or new PLD configurations may be optionally modified to remedy setup time violations in accordance with various known techniques.

Embodiments described above illustrate but do not limit the invention. It should also be understood that numerous modifications and variations are possible in accordance with the principles of the present invention. Accordingly, the scope of the invention is defined only by the following claims.

We claim:

1. A method of synchronizing data signals and clock signals of a programmable logic device (PLD), the method comprising:
    preparing an initial configuration of the PLD identifying a plurality of data paths associated with the data signals and a plurality of clock paths associated with the clock signals;
    identifying a hold time violation associated with at least one of the data paths, wherein at least one of the clock signals is used to synchronize the data path; and
    selectively adjusting a delay period of a delay element of at least one of the clock paths associated with the clock signal to attempt to correct the hold time violation without concurrently attempting to correct any setup time violation associated with the data path.

2. The method of claim 1, further comprising selectively adjusting a timing preference from a first value to a second value if the hold time violation is not corrected by the adjusting of the delay period, wherein the timing preference is associated with the clock signal.

3. The method of claim 2, further comprising repeating the adjusting of the delay period and the adjusting of the timing preference until the timing preference reaches a maximum value.

4. The method of claim 2, further comprising preparing a revised configuration of the PLD using the adjusted timing preference.

5. The method of claim 2, wherein the timing preference is a clock period associated with the clock signal.

6. The method of claim 2, wherein the first value of the timing preference is a minimum value and the second value of the timing preference value is a value between the minimum value and a maximum value.

7. The method of claim 2, wherein the hold time violation is a first hold time violation, the data path is a first data path, the delay period is a first delay period, the delay element is a first delay element, the clock path is a first clock path, and the clock signal is a first clock signal, the method further comprising:
    identifying a second hold time violation associated with at least a second one of the data paths; and
    refraining from attempting to correct the second hold time violation if selective adjustment of a second delay period of a second delay element of a second clock path associated with a second clock signal used to synchronize the second data path cannot satisfy a hold time constraint associated with the second data path.

8. The method of claim 2, wherein the data path is a first data path, the delay period is a first delay period, the delay element is a first delay element, the clock path is a first clock path, and the clock signal is a first clock signal, the method further comprising:
    determining that a second one of the data paths satisfies an associated hold time constraint; and
    refraining from adjusting a second delay period of a second delay element of a second clock path associated with a second clock signal used to synchronize the second data path if the hold time constraint is satisfied for all available delay periods of the second delay element.

9. The method of claim 2, wherein the timing preference is a first timing preference, the clock signal is a first clock signal, the hold time violation is a first hold time violation, the data path is a first data path, the delay period is a first delay period, the delay element is a first delay element, and the clock path is a first clock path, the method further comprising:
    identifying a second hold time violation associated with at least a second one of the data paths, wherein the second clock signal is used to synchronize the data path;
    selectively adjusting a second delay period of a second delay element of at least a second one of the clock paths associated with a second one of the clock signals to attempt to correct the second hold time violation without concurrently attempting to correct any setup time violation associated with the second data path;
    selectively adjusting a second timing preference from a third value to a fourth value if the second hold time violation is not corrected by the adjusting of the second delay period, wherein the second timing preference is associated with the second clock signal; and
    sorting the first and second timing preferences based on their relative impact on setup time slack values of the PLD, wherein the adjusting of the first delay period and the adjusting of the first timing preference are performed prior to the adjusting of the second delay period and the adjusting of the second timing preference based on the sorting.

10. A computer readable medium on which is stored a computer program for performing the method of claim 1.

11. A system comprising:
    one or more processors; and
    one or more memories adapted to store a plurality of computer readable instructions which when executed by the one or more processors are adapted to cause the system to perform a method of synchronizing data signals and clock signals of a programmable logic device (PLD), the method comprising:
        preparing an initial configuration of the PLD identifying a plurality of data paths associated with the data signals and a plurality of clock paths associated with the clock signals,
        identifying a hold time violation associated with at least one of the data paths, wherein at least one of the clock signals is used to synchronize the data path, and
        selectively adjusting a delay period of a delay element of at least one of the clock paths associated with the clock signal to attempt to correct the hold time violation without concurrently attempting to correct any setup time violation associated with the data path.

12. The system of claim 11, wherein the method further comprises selectively adjusting a timing preference from a first value to a second value if the hold time violation is not corrected by the adjusting of the delay period, wherein the timing preference is associated with the clock signal.

13. The system of claim 12, wherein the method further comprises repeating the adjusting of the delay period and the adjusting of the timing preference until the timing preference reaches a maximum value.

14. The system of claim 12, wherein the method further comprises preparing a revised configuration of the PLD using the adjusted timing preference.

15. The system of claim 12, wherein the timing preference is a clock period associated with the clock signal.

16. The system of claim 12, wherein the first value of the timing preference is a minimum value and the second value of the timing preference value is a value between the minimum value and a maximum value.

17. The system of claim 12, wherein the hold time violation is a first hold time violation, the data path is a first data path, the delay period is a first delay period, the delay element is a first delay element, the clock path is a first clock path, and the clock signal is a first clock signal, wherein the method further comprises:

identifying a second hold time violation associated with at least a second one of the data paths; and refraining from attempting to correct the second hold time violation if selective adjustment of a second delay period of a second delay element of a second clock path associated with a second clock signal used to synchronize the second data path cannot satisfy a hold time constraint associated with the second data path.

18. The system of claim 12, wherein the data path is a first data path, the delay period is a first delay period, the delay element is a first delay element, the clock path is a first clock path, and the clock signal is a first clock signal, wherein the method further comprises:

determining that a second one of the data paths satisfies an associated hold time constraint; and refraining from adjusting a second delay period of a second delay element of a second clock path associated with a second clock signal used to synchronize the second data path if the hold time constraint is satisfied for all available delay periods of the second delay element.

19. The system of claim 12, wherein the timing preference is a first timing preference, the clock signal is a first clock signal, the hold time violation is a first hold time violation, the data path is a first data path, the delay period is a first delay period, the delay element is a first delay element, and the clock path is a first clock path, wherein the method further comprises:

identifying a second hold time violation associated with at least a second one of the data paths, wherein the second clock signal is used to synchronize the data path;

selectively adjusting a second delay period of a second delay element of at least a second one of the clock paths associated with a second one of the clock signals to attempt to correct the second hold time violation without concurrently attempting to correct any setup time violation associated with the second data path;

selectively adjusting a second timing preference from a third value to a fourth value if the second hold time violation is not corrected by the adjusting of the second delay period, wherein the second timing preference is associated with the second clock signal; and sorting the first and second timing preferences based on their relative impact on setup time slack values of the PLD, wherein the adjusting of the first delay period and the adjusting of the first timing preference are performed prior to the adjusting of the second delay period and the adjusting of the second timing preference based on the sorting.

20. A system for synchronizing data signals and clock signals of a programmable logic device (PLD), the system comprising:

means for preparing an initial configuration of the PLD identifying a plurality of data paths associated with the data signals and a plurality of clock paths associated with the clock signals;

means for identifying a hold time violation associated with at least one of the data paths, wherein at least one of the clock signals is used to synchronize the data path; and means for selectively adjusting a delay period of a delay element of at least one of the clock paths associated with the clock signal to attempt to correct the hold time violation without concurrently attempting to correct any setup time violation associated with the data path.

* * * * *